United States Patent
Ochi et al.

(10) Patent No.: US 9,337,409 B2
(45) Date of Patent: May 10, 2016

(54) THERMOELECTRIC CONVERSION MODULE

(75) Inventors: Takahiro Ochi, Ibaraki (JP); Shogo Suzuki, Ibaraki (JP); Masaaki Kikuchi, Ibaraki (JP); Huiyuan Geng, Ibaraki (JP); Satoru Ito, Ibaraki (JP); Junqing Guo, Ibaraki (JP)

(73) Assignee: FURUKAWA CO., LTD., Tokyo (JP)

( * ) Notice: Subject to any disclaimer, the term of this patent is extended or adjusted under 35 U.S.C. 154(b) by 0 days.

(21) Appl. No.: 14/342,115

(22) PCT Filed: Nov. 22, 2011

(86) PCT No.: PCT/JP2011/006512
§ 371 (c)(1),
(2), (4) Date: Feb. 28, 2014

(87) PCT Pub. No.: WO2013/076765
PCT Pub. Date: May 30, 2013

(65) Prior Publication Data
US 2014/0216515 A1    Aug. 7, 2014

(51) Int. Cl.
*H01L 35/10*    (2006.01)
*H01L 35/08*    (2006.01)

(52) U.S. Cl.
CPC ............... *H01L 35/10* (2013.01); *H01L 35/08* (2013.01)

(58) Field of Classification Search
CPC ................................ H01L 35/10; H01L 35/08
USPC ........................................................ 136/208
See application file for complete search history.

(56) References Cited

U.S. PATENT DOCUMENTS

| | | | |
|---|---|---|---|
| 3,859,143 A | 1/1975 | Krebs | |
| 5,841,064 A | 11/1998 | Okada | |
| 2002/0024154 A1 | 2/2002 | Tomita | |
| 2010/0294326 A1* | 11/2010 | Guo et al. | 136/238 |

FOREIGN PATENT DOCUMENTS

| | | |
|---|---|---|
| JP | 2001203400 A2 | 7/2001 |
| JP | 2003-092435 | 3/2003 |
| JP | 2003-309294 | 10/2003 |
| JP | 2004-221424 | 8/2004 |
| JP | 2005-019910 | 1/2005 |
| JP | 2005340559 A2 | 12/2005 |

(Continued)

OTHER PUBLICATIONS

Japanese Office Action mailed on Apr. 1, 2014, filed in the corresponding Japanese Patent Application No. 2010-120075.

(Continued)

*Primary Examiner* — Jayne Mershon
(74) *Attorney, Agent, or Firm* — Rankin, Hill & Clark LLP

(57) ABSTRACT

A thermal stress of electrode members (121 to 123) due to an operation temperature may be relaxed by thermal stress relaxation layers (141 to 144), and thus peeling of the electrode members (121 to 123) due to thermal stress at the operation temperature may be prevented in a satisfactory manner. Furthermore, diffusion of a constituent component of the thermoelectric conversion members (111 and 112) due to the operation temperature and the like may be prevented by diffusion prevention layers (151 to 154), and thus durability and stability of the thermoelectric conversion module (100) may be improved.

10 Claims, 3 Drawing Sheets

(56) References Cited

FOREIGN PATENT DOCUMENTS

| | | | |
|---|---|---|---|
| JP | 2006032620 A2 | | 2/2006 |
| JP | 2010-205977 | * | 9/2010 |
| JP | 2011-249492 | | 12/2011 |
| WO | 2009/093455 | | 7/2009 |
| WO | WO 2009-093455 | * | 7/2009 |
| WO | 2010/106878 | | 9/2010 |

OTHER PUBLICATIONS

International Search Report dated Feb. 28, 2012 filed in PCT/JP2011/006512.

Extended European Search Report dated May 29, 2015 issued for the corresponding European patent application No. 11876342.4.

* cited by examiner

THERMOELECTRIC CONVERSION MODULE

TECHNICAL FIELD

The present invention relates to a thermoelectric conversion module which is capable of directly converting thermal energy to electricity or electricity to thermal energy.

BACKGROUND ART

A thermoelectric conversion member is a material that is capable of directly converting thermal energy to electricity or directly converting electric energy to thermal energy, that is, performing heating or cooling by applying electricity.

When a plurality of pairs of p/n thermoelectric conversion members, in which a p-type thermoelectric conversion member and an n-type thermoelectric conversion member are combined, are electrically connected in series, one thermoelectric conversion module is formed. When using the thermoelectric conversion module, waste heat that conventionally has not been used so much may be converted into electricity, whereby energy may be effectively utilized.

Examples of a representative thermoelectric conversion member used for the thermoelectric conversion module, which are representative of research conducted up until now, include a $Bi_2Te_3$ system, a PbTe system, an $AgSbTe_2$—GeTe system, a SiGe system, a (Ti, Zr, Hf) NiSn system, Skutterudite and filled Skutterudite systems represented by $CoSb_3$, a $Zn_4Sb_3$ system, an $FeSi_2$ system, $NaCo_2O_4$-based oxides, $Ca_3Co_4O_9$-based oxides, and the like.

However, among these, only the $Bi_2Te_3$ system is in practical use. In the thermoelectric conversion module using the $Bi_2Te_3$-based thermoelectric conversion member, a temperature range that may be used for power generation is limited to a range from in the vicinity of room temperature to a maximum 250° C. that $Bi_2Te_3$-based material may endure.

Therefore, from the viewpoint of effectively using various kinds of waste heat, there has been a demand for a thermoelectric conversion module which may be used in an intermediate temperature range of 300° C. to 600° C. In recent years, particularly, as a thermoelectric conversion member that may be used in this temperature range, a thermoelectric conversion member having a filled Skutterudite structure has attracted attention.

A filled Skutterudite compound is expressed by a chemical formula of $RT_4X_{12}$, and has a cubic structure of a space group Im-3 (No. 204). In the formula, R represents an alkaline-earth metal and an element of lanthanoid series or actinoid series, T represents a transition metal such as Fe, Ru, Os, Co, Pd, and Pt, and X represents pnictogen elements such as As, P, and Sb.

Particularly, a thermoelectric conversion member of the filled Skutterudite system in which X is Sb has been actively studied. The thermoelectric conversion member of the filled Skutterudite system exhibits high thermoelectric performance at the intermediate temperature range.

When preparing the thermoelectric conversion module using the thermoelectric conversion member, it is necessary to bond respective p-type and n-type thermoelectric conversion members and electrode members at a high-temperature portion and a low-temperature portion. The thermoelectric conversion module using the $Bi_2Te_3$-based thermoelectric conversion member is used at a temperature range of 250° C. or lower.

Accordingly, this bonding is carried out according to a relatively easy method using solder, a brazing filler material, or the like without excessively considering an effect of heat.

On the other hand, when preparing a thermoelectric conversion module that may be used at an intermediate temperature region of 300° C. to 600° C., material selection of an electrode member that connects a p-type thermoelectric conversion member and an n-type thermoelectric conversion member and material selection of a bonding method are important problems.

It is necessary that bondability is good between the electrode member and each of the thermoelectric conversion members and that performance deterioration of the thermoelectric conversion member due to the electrode member does not occur. To realize these, in a usage temperature range up to 600° C., matching properties in a thermal expansion coefficient between the thermoelectric conversion member, the electrode member, and a material used for bonding thereof and stability of a bonding layer at a bonding interface are necessary.

When a difference in thermal expansion coefficient is large, a large thermal stress is generated, and thus there is a problem in that fracture of a bonded portion occurs. In addition, when element diffusion progresses at the bonding interface, deterioration of a thermoelectric performance and a decrease in performance of the electrode member occur in the electrode member and the thermoelectric conversion member.

If the thermoelectric conversion module can be prepared using the filled Skutterudite-based thermoelectric conversion member, it is possible to use an element having high conversion efficiency in a further higher temperature region compared to the thermoelectric conversion module in which $Bi_2Te_3$ is used in the related art. However, solder may not be used at a bonding portion between the thermoelectric conversion member and the electrode member at a high-temperature portion.

In addition, antimony (Sb) which is a constituent component of the filled Skutterudite-based thermoelectric conversion member, an electrode member of copper (Cu) which is used in the related art, and a brazing filler material or a paste material for bonding of the electrode member react with each other, and thus, when these are bonded to each other, a deterioration of the constituent material occurs over the passage of time. Accordingly, the lifespan of the thermoelectric conversion module comes to an end without exhibiting the original performance of the thermoelectric conversion member, and there is a problem of durability.

With regard to the above-described problem, there is a suggestion for a thermoelectric conversion module in which titanium or an alloy layer of a titanium alloy is provided between the thermoelectric conversion member and the electrode member at the high-temperature portion related to the thermoelectric conversion member having the Skutterudite structure.

More specifically, in the thermoelectric conversion module including an n-type thermoelectric element and a p-type thermoelectric element, a titanium layer or a titanium alloy layer having a thickness of 10 μm or more is formed in at least one of the n-type thermoelectric element and the p-type thermoelectric element.

There is disclosed that a compound having a Skutterudite type crystal structure is used as a material of the n-type element, and for example, the following compounds are exemplified.

(1) Compound Expressed by $M_{1-A}M'_AX_B$

Here, M represents any one of Co, Rh, and Ir, M' is a dopant for realizing an n-type and represents any one of Pd, Pt, and PdPt, X represents any one of As, P, and Sb, and it is preferable that conditions of $0<A≤0.2$ and $2.9≤B≤4.2$ be satisfied.

Particularly, when B is set to 3, a compound having a simple composition ratio may be obtained. As a specific example, a Co—Sb-based compound, for example, $Co_{0.9}(PdPt)_{0.1}Sb_3$ may be exemplified. Here, instead of $Co_{0.9}(PdPt)_{0.1}Sb_3$, $CoSb_3$ having the same structure may be used.

(2) Compound Expressed by $M(X_{1-A}X'_A)_3$

Here, M represents any one of Co, Rh, and Ir, X represents any one of As, P, and Sb, X' represents any one of Te, Ni, and Pd, and it is preferable that a condition of $0<A\leq 0.1$ be satisfied.

(3) Compound Expressed by $M_{1-A}M'_A(X_{1-B}X'_B)_C$

Here, M represents any one of Co, Rh, and Ir, M' is a dopant to realize an n-type and represents any one of Pd, Pt, and PdPt, X represents any one of As, P, and Sb, X' represents any one of Te, Ni, and Pd, and it is preferable that conditions of $0<A\leq 0.2$, $0\leq B\leq 0.1$, and $C=3$ be satisfied.

With regard to the above-described thermoelectric conversion module, in a thermoelectric conversion module using n-type and p-type thermoelectric elements having excellent characteristics in a high-temperature region in the vicinity of 500° C., element diffusion at a bonding portion and the like may be prevented (for example, refer to Patent Document 1).

RELATED DOCUMENT

Patent Document

[Patent Document 1] Japanese Unexamined Patent Publication No. 2003-309294

DISCLOSURE OF THE INVENTION

However, the present inventors have carried out an additional test using the filled Skutterudite-based thermoelectric conversion member with Ti as a bonding material, and it has been proved that sufficient bonding strength between the filled Skutterudite-based thermoelectric conversion member and the electrode member may not be secured.

As one cause of this, it is considered that as the temperature becomes high, particularly, at a temperature of 400° C. or higher, a difference between the thermal expansion coefficient of the thermoelectric conversion member and the thermal expansion coefficient of the electrode member increases, and thus a thermal stress is generated.

The present invention has been made in consideration of the above-described problem, and an object thereof is to provide a thermoelectric conversion module which is capable of maintaining bonding between a thermoelectric conversion member and an electrode member in a satisfactory manner even when a temperature largely varies due to an operation or the like, and which is capable of preventing diffusion of a constituent component of the thermoelectric conversion member.

According to an aspect of the invention, there is provided a thermoelectric conversion module including a thermoelectric conversion member and an electrode member. The thermoelectric conversion member and the electrode member are bonded by a bonding member. The bonding member includes a thermal stress relaxation layer that is bonded to the electrode member to relax a thermal stress and includes a diffusion prevention layer that is bonded to the thermoelectric conversion member to prevent diffusion of a constituent component. Young's modulus of the thermal stress relaxation layer at 25° C. is smaller than that of the thermoelectric conversion members and the electrode members.

That is, in the thermoelectric conversion module of the invention, the bonding member that bonds the thermoelectric conversion member and the electrode member includes the thermal stress relaxation layer that is bonded to the electrode member to relax a thermal stress and includes the diffusion prevention layer that is bonded to the thermoelectric conversion member to prevent diffusion of a constituent component. Accordingly, the thermal stress of the electrode member due to the operation temperature and the like is relaxed by the thermal stress relaxation layer, and diffusion of a constituent component of the thermoelectric conversion member due to the operation temperature and the like is prevented by the diffusion prevention layer.

When a difference in a thermal expansion coefficient is present between heterogeneous members, amounts of thermal expansion of bonded portions become different from each other due to a temperature variation. Accordingly, a thermal stress is generated at a bonding portion. The stress is proportional to the Young's modulus and strain of the members, and thus as the Young's modulus is small, the stress becomes small.

On the other hand, a member having a small Young's modulus has a tendency to be deformed, and at the bonding portion of the bonded heterogeneous members, the stress is relaxed by the deformation. A bonding member having small Young's modulus is deformed earlier than the thermoelectric conversion member and the electrode member and is capable of relaxing a thermal stress and preventing fracture of the thermoelectric conversion member and the electrode member.

In addition, the Young's modulus of the thermoelectric conversion member at 25° C. is 140 GPa, and thus in the above-described thermoelectric conversion module, it is preferable that the Young's modulus of the thermal stress relaxation layer at 25° C. be 130 GPa or less.

In addition, in the above-described thermoelectric conversion module, the electrode member may be composed of at least one kind of alloy selected from a group consisting of an Fe alloy, a Ni alloy, a Co alloy, a Cu alloy, a Ti alloy, and an Al alloy. The thermal stress relaxation layer may be composed of at least one kind of alloy selected from a group consisting of a Cu alloy, an Ag alloy, an Au alloy, an Al alloy, and a Mg alloy. The diffusion prevention layer may be composed of at least one kind of alloy selected from a group consisting of an Fe-M1 (M1 represents at least one kind of element selected from a group consisting of Cr, Mo, W, V, Nb, Ta, Mn, Ti, Zr, Hf, C, Si, and Ge) alloy, a Co-M1 alloy, a Ni-M1 alloy, a Ti-M2 (M2 represents at least one kind of element selected from a group consisting of Al, Ga, In, Cu, Ag, Au, Sn, Zn, and Mg) alloy, a Zr-M2 alloy, a Hf-M2 alloy, a V-M2 alloy, a Nb-M2 alloy, a Ta-M2 alloy, a Cr-M2 alloy, a Mo-M2 alloy, and a W-M2 alloy.

In addition, in the above-described thermoelectric conversion module, the stress relaxation layer may be composed of at least one kind of alloy selected from a group consisting of a Cu-M3 (M3 represents at least one kind of element selected from a group consisting of Ag, Au, Cu, Zn, Cd, Al, Ga, In, Si, Ge, Sn, Pb, P, Bi, Li, Mg, and Cr) alloy, an Ag-M3 alloy, an Au-M3 alloy, an Al-M3 alloy, and a Mg-M3 alloy.

In addition, in the above-described thermoelectric conversion module, with regard to the bonding member, the stress relaxation layer and the diffusion prevention layer may be bonded by an auxiliary bonding layer. The stress relaxation layer may be composed of an M4 (M4 represents at least one kind of element selected from a group consisting of Cu, Ag, Au, Al, and Mg)-M3 (M3 represents at least one kind of element selected from a group consisting of Ag, Au, Cu, Zn, Cd, Al, Ga, In, Si, Ge, Sn, Pb, P, Bi, Li, Mg, and Cr) alloy. The auxiliary bonding layer may be composed of at least one kind of alloy selected from a group consisting of an Fe alloy, a Ni alloy, a Co alloy, a Cu alloy, a Ti alloy, and an Al alloy.

In addition, in the above-described thermoelectric conversion module, the diffusion prevention layer may be composed of an M5-M1 alloy containing 50% by weight or more and less than 100% by weight of M5 (M5 represents at least one kind of element selected from a group consisting of Fe, Co, and Ni) and more than 0% by weight and 50% by weight or less of M1 (M1 represents at least one kind of element selected from a group consisting of Cr, Mo, W, V, Nb, Ta, Mn, Ti, Zr, Hf, C, Si, and Ge).

In addition, in the above-described thermoelectric conversion module, the diffusion prevention layer may be composed of an M6-M2 alloy containing 50% by weight or more and less than 100% by weight of M6 (M6 represents at least one kind of element selected from a group consisting of Ti, Zr, Hf, V, Nb, Ta, Cr, Mo, W, and Mn) and more than 0% by weight and 50% by weight or less of M2 (M2 represents at least one kind of element selected from a group consisting of Al, Ga, In, Cu, Ag, Au, Sn, Zn, and Mg).

In addition, in the above-described thermoelectric conversion module, a difference in a thermal expansion coefficient between the diffusion prevention layer and the thermoelectric conversion member at 20° C. to 600° C. may be 20% or less than the thermal expansion coefficient of the thermoelectric conversion member.

In addition, in the above-described thermoelectric conversion module, the thermal expansion coefficient of the diffusion prevention layer at 20° C. to 600° C. may be $8 \times 10^{-6}$ (/K) or more and $15 \times 10^{-6}$ (/K) or less.

In addition, in the above-described thermoelectric conversion module, the thermoelectric conversion member may be composed of an Sb system of a Skutterudite structure.

In addition, in the above-described thermoelectric conversion module, the thermoelectric conversion member may be composed of a filled Skutterudite structure. Furthermore, an R-T-M-X-N-based thermoelectric conversion member having a filled Skutterudite structure expressed by a general formula of $R_r T_{t-m} M_m X_{x-n} N_n$ ($0 < r \leq 1$, $3 \leq t-m \leq 5$, $0 \leq m \leq 0.5$, $10 \leq x \leq 15$, and $0 \leq n \leq 2$) is preferable. Here, R is composed of three or more kinds of elements selected from a group consisting of a rare-earth element, an alkali metal element, an alkaline-earth metal element, an element of Group IV, and an element of Group XIII, T represents at least one kind selected from Fe and Co, M represents at least one kind selected from a group consisting of Ru, Os, Rh, Ir, Ni, Pd, Pt, Cu, Ag, and Au, X represents at least one kind selected from a group consisting of P, As, Sb, and Bi, and N represents at least one kind selected from Se and Te.

In addition, in the invention, the difference in the thermal expansion coefficient between the thermoelectric conversion member and the bonding member represents an absolute value of a difference between the thermal expansion coefficient of the thermoelectric conversion member and the thermal expansion coefficient of the bonding member.

In the thermoelectric conversion module of the invention, since the thermal stress of the electrode member due to an operation temperature and the like may be relaxed by the thermal stress relaxation layer, peeling of the electrode member due to the thermal stress at an operation temperature and the like may be prevented in a satisfactory manner. Furthermore, since diffusion of a constituent component of the thermoelectric conversion member due to the operation temperature and the like may be prevented by the diffusion prevention layer, durability and stability of the thermoelectric conversion module may be improved.

BRIEF DESCRIPTION OF THE DRAWINGS

The above and other objects, advantages, and features of the present invention will be more apparent from the following description of a certain preferred embodiment taken in conjunction with the accompanying drawings.

DESCRIPTION OF EMBODIMENTS

Figure 1:
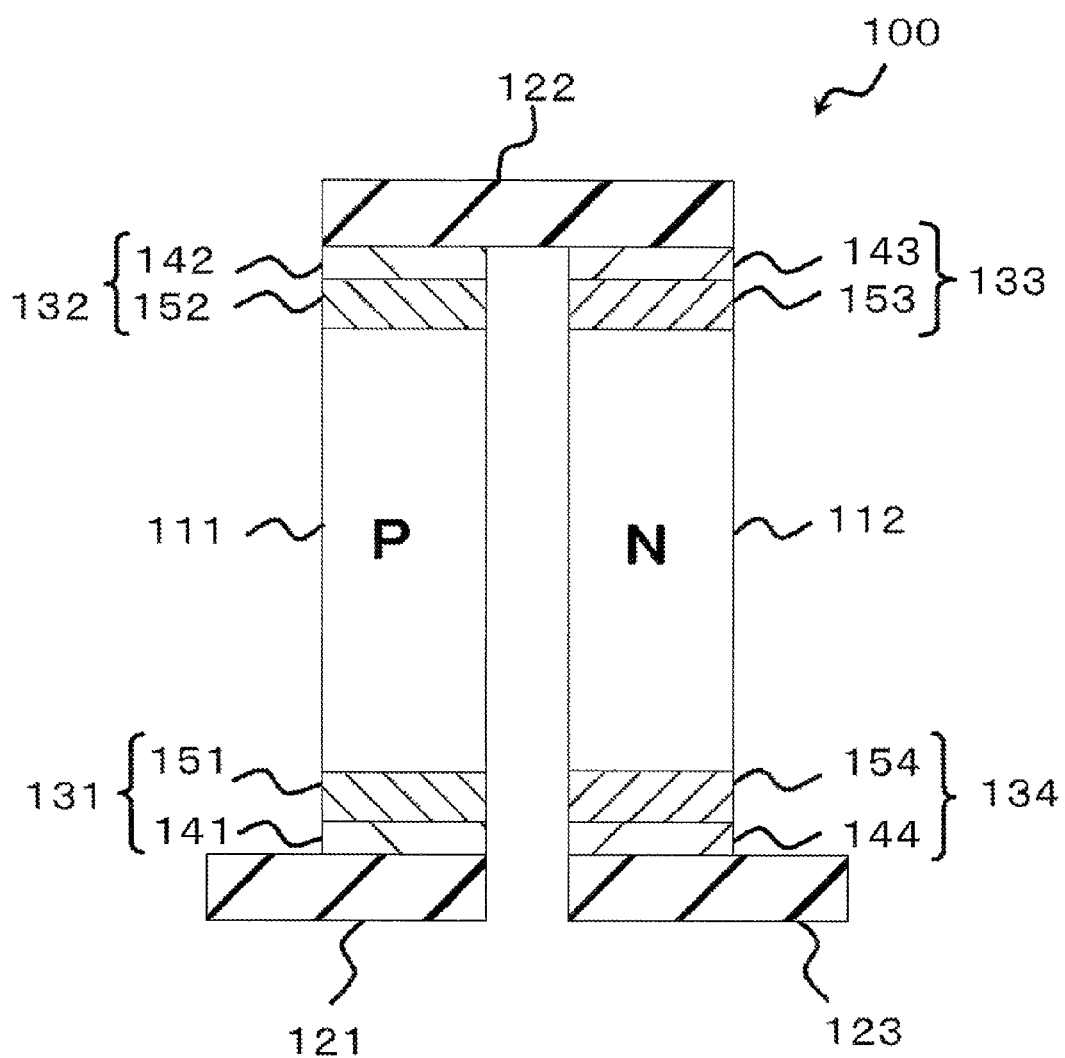
FIG. 1 shows a schematic front view illustrating a structure of a thermoelectric conversion module of an embodiment of the invention.

An embodiment of the invention will be described below with reference to the attached drawings. FIG. 1 shows a schematic view illustrating an example of a thermoelectric conversion module of an embodiment of the invention. As shown in FIG. 1, a thermoelectric conversion module 100 of the embodiment includes p-type and n-type thermoelectric conversion members 111 and 112 and electrode members 121 to 123.

Furthermore, in the thermoelectric conversion module 100 of the embodiment, the thermoelectric conversion members 111 and 112 and the electrode members 121 to 123 are bonded by bonding members 131 and 134, respectively. Each of the bonding members 131 to 134 includes each of thermal stress relaxation layers 141 to 144 that are bonded to the electrode members 121 to 123 to relax a thermal stress and includes each of diffusion prevention layers 151 to 154 that are bonded to the thermoelectric conversion members 111 and 112 to prevent diffusion of a constituent component.

In addition, Young's modulus of the thermal stress relaxation layers 141 to 144 is smaller than that of the thermoelectric conversion members 111 and 112 and the electrode members 121 to 123. The Young's modulus of the thermoelectric conversion members 111 and 112 at 25° C. is 140 GPa, and thus it is preferable that the Young's modulus of the thermal stress relaxation layers 141 to 144 at 25° C. be 130 GPa or less.

Electrode members of the Fe alloy system, the Ni alloy system, the Co alloy system, the Cu alloy system, the Ti alloy system, and the Al alloy system have Young's modulus at 25° C. of approximately 200 GPa, approximately 200 GPa, approximately 200 GPa, approximately 130 GPa, approximately 120 GPa, and approximately 70 GPa, respectively.

Therefore, it is preferable that the thermal stress relaxation layers 141 to 144 corresponding to materials of electrode members satisfy a condition in which Young's modulus at 25° C. is 130 GPa or less and in which members having Young's modulus smaller than that of the electrode members are employed.

The thermoelectric conversion members 111 and 112 are composed of a compound having a filled Skutterudite structure expressed by a general formula $R_r T_{t-m} M_m X_{x-n} N_n$ ($0 < r \leq 1$, $3 \leq t-m \leq 5$, $0 \leq m \leq 0.5$, $10 \leq x \leq 15$, and $0 \leq n \leq 2$).

R is composed of three or more kinds of elements selected from a group consisting of a rare-earth element, an alkali metal element, an alkaline-earth metal element, an element of Group IV, and an element of Group XIII. T represents at least one kind selected from Fe and Co, M represents at least one kind selected from a group consisting of Ru, Os, Rh, Ir, Ni, Pd, Pt, Cu, Ag, and Au, X represents at least one kind selected from a group consisting of P, As, Sb, and Bi, and N represents at least one kind selected from Se and Te.

Furthermore, it is preferable that the p-type thermoelectric conversion member 111 be composed of an Sb-based compound having a filled Skutterudite structure of (La, Ba, Ga, Ti)$_{0.7 \text{ to } 1.0}$ (Fe, Co)$_4$Sb$_{12}$ and that the n-type thermoelectric conversion member 112 be composed of an Sb-based compound having a filled Skutterudite structure of (Yb, Ca, Al, Ga, In)$_{0.5 \text{ to } 0.8}$ (Fe, Co)$_4$Sb$_{12}$.

In addition, the electrode members 121 to 123 are composed of at least one kind of alloy selected from a group consisting of an Fe alloy, a Ni alloy, a Co alloy, a Cu alloy, a Ti alloy, and an Al alloy and are formed from SUS430. Cu, or a Cu alloy in the embodiment.

In addition, the thermal stress relaxation layers 141 to 144 are composed of at least one kind of alloy selected from a group consisting of a Cu alloy, an Ag alloy, an Au alloy, an Al alloy, and a Mg alloy, and is formed from the Ag alloy in the embodiment. In addition, the thermal stress relaxation layers 141 to 144 may be formed as a layer composed of one kind of alloy as described above but may also be formed as a layer composed of two or more kinds of alloys.

The diffusion prevention layers 151 to 154 are composed of at least one kind of alloy selected from a group consisting of an Fe-M1 (M1 represents at least one kind of element selected from a group consisting of Cr, Mo, W, V, Nb, Ta, Mn, Ti, Zr, Hf, C, Si, and Ge) alloy, a Co-M1 alloy, a Ni-M1 alloy, a Ti-M2 (M2 represents at least one kind of element selected from a group consisting of Al, Ga, In, Cu, Ag, Au, Sn, Zn, and Mg) alloy, a Zr-M2 alloy, a Hf-M2 alloy, a V-M2 alloy, a Nb-M2 alloy, a Ta-M2 alloy, a Cr-M2 alloy, a Mo-M2 alloy, and a W-M2 alloy.

More specifically, the diffusion prevention layers 151 to 154 are composed of an M5-M1 alloy containing 50% by weight or more and less than 100% by weight of M5 (M5 represents at least one kind of element selected from a group consisting of Fe, Co, and Ni) and more than 0% by weight and 50% by weight or less of M1.

In the embodiment, the diffusion prevention layers 151 and 152 that are bonded to the p-type thermoelectric conversion member 111 are formed from an Fe70 to 80 (% by weight)-Cr15 to 20 (% by weight)-Si0 to 10 (% by weight) alloy.

The diffusion prevention layers 153 and 154 that are bonded to the n-type thermoelectric conversion member 111 is formed from an Fe60 to 70 (% by weight)-Cr30 to 40 (% by weight), Fe80 to 90 (% by weight)-V10 to 20 (% by weight) alloy, and an Fe70 to 80 (% by weight)-Cr10 to 15 (% by weight)-V5 to 15 (% by weight) alloy. In addition, the diffusion prevention layers 151 to 154 may be formed as a layer composed of one kind of alloy as described above but may be formed as a layer composed of two or more kinds of alloys.

In addition, the thermal stress relaxation layers 141 to 144 are composed of at least one kind of alloy selected from a group consisting of a Cu-M3 (M3 represents at least one kind of element selected from a group consisting of Ag, Au, Cu, Zn, Cd, Al, Ga, In, Si, Ge, Sn, Pb, P, Bi, Li, Mg, and Cr) alloy, an Ag-M3 alloy, an Au-M3 alloy, an Al-M3 alloy, and a Mg-M3 alloy.

In the embodiment, the thermal stress relaxation layers 141 to 144 are formed from an Ag50 to 60 (% by weight)-(Cu, Zn) 40 to 50 (% by weight) alloy, or an Ag50 to 60 (% by weight)-(Cu, Zn, Sn) 40 to 50 (% by weight) alloy.

In addition, in the thermoelectric conversion module 100 of the embodiment, a difference in a thermal expansion coefficient between the diffusion prevention layers 151 to 154 and the thermoelectric conversion members 111 and 112 at 20° C. to 600° C. is 20% or less of the thermal expansion coefficient of the thermoelectric conversion members 111 and 112. Furthermore, the thermal expansion coefficient of the diffusion prevention layers 151 to 154 at 20° C. to 600° C. is 8×10$^{-6}$ (/K) or more and 1.5×10$^{-6}$ (/K) or less.

In the above-described configuration, in the thermoelectric conversion module 100 of the embodiment, each of the bonding members 131 to 134 that bond the thermoelectric conversion members 111 and 112 and the electrode members 121 to 123 includes each of the thermal stress relaxation layers 141 to 144 that are bonded to the electrode members 121 to 123 to relax a thermal stress, and each of the diffusion prevention layers 151 to 154 that are bonded to the thermoelectric conversion members 111 and 112 to prevent diffusion of a constituent component.

Accordingly, since the thermal stress of the electrode members 121 to 123 due to an operation temperature and the like may be relaxed by the thermal stress relaxation layers 141 to 144, peeling of the electrode members 121 to 123 due to the thermal stress at the operation temperature, and the like may be prevented in a satisfactory manner.

Furthermore, since diffusion of a constituent component of the thermoelectric conversion members 111 and 112 due to the operation temperature and the like may be prevented by the diffusion prevention layers 151 to 154, durability and stability of the thermoelectric conversion module 100 may be improved.

Furthermore, the Young's modulus of the thermal stress relaxation layers 141 to 144 is smaller than that of the thermoelectric conversion members 111 and 112 and the electrode members 121 to 123, and the Young's modulus at 25° C. is 130 GPa or less.

Accordingly, even when it reaches a high temperature due to the operation of the thermoelectric conversion module 100, the thermal stress of the thermoelectric conversion members 111 and 112 and the electrode members 121 to 123 may be relaxed by the thermal stress relaxation layers 141 to 144 in a satisfactory manner. As a result, bonding between the thermal stress relaxation layers 141 to 144 and the electrode members 121 to 123 may be maintained in a satisfactory manner.

Furthermore, in the thermoelectric conversion module 100 of the embodiment, a difference in a thermal expansion coefficient between the diffusion prevention layers 151 to 154 and the thermoelectric conversion members 111 and 112 at 20° C. to 600° C. is 20% or less of the thermal expansion coefficient of the thermoelectric conversion members 111 and 112.

Accordingly, even when it reaches a high temperature due to the operation of the thermoelectric conversion module 100, bonding between the diffusion prevention layers 151 to 154 and the thermoelectric conversion members 111 and 112 may be maintained in a satisfactory manner.

In addition, in the thermoelectric conversion members 111 and 112 having a filled Skutterudite structure, particularly, in the thermoelectric conversion members 111 and 112 having an Sb-based filled Skutterudite structure, the thermal expansion coefficient at 20° C. to 600° C. is commonly within a range of 8×10$^{-6}$ (/K) or more and 15×10$^{-6}$ (/K) or less.

In addition, in the embodiment, the thermal expansion coefficient of the diffusion prevention layers 151 to 154 at 20° C. to 600° C. is 8×10$^{-6}$ (/K) or more and 15×10$^{-6}$ (/K) or less. Accordingly, even when it reaches a high temperature due to the operation of the thermoelectric conversion module 100, bonding between the thermoelectric conversion members 111 and 112 and the diffusion prevention layers 151 to 154 may be maintained in a satisfactory manner.

In addition, the invention is not limited to the embodiment, and various modifications are permitted within a range not departing from the gist of the invention. For example, in the embodiment, direct bonding between the thermal stress relaxation layers 141 to 144 and the diffusion prevention layers 151 to 154 of the bonding members 134 to 134 is exemplified.

Figure 2:
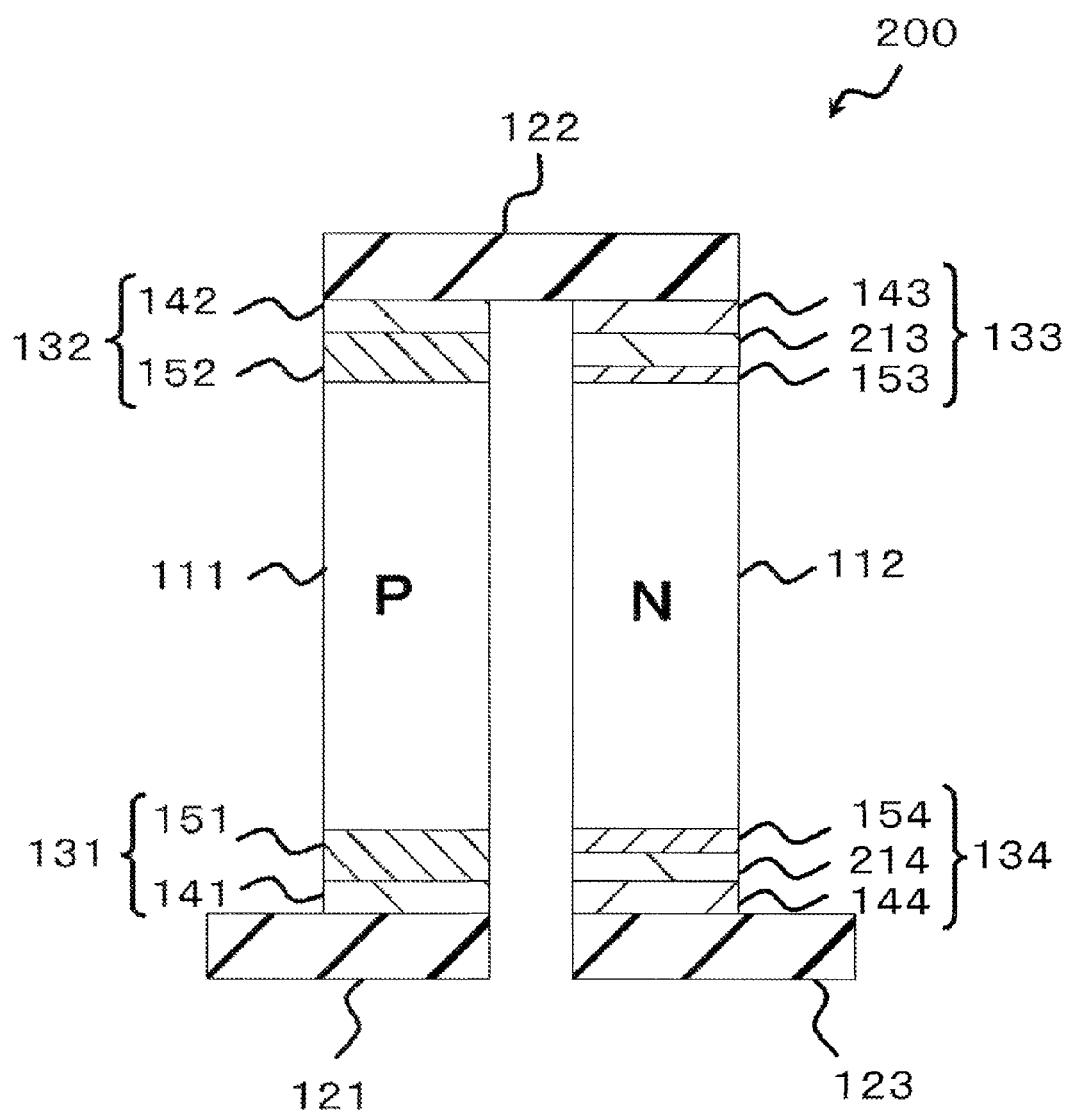
FIG. 2 shows a schematic front view illustrating a structure of a thermoelectric conversion module of a modification example.

However, like a thermoelectric conversion module 200 shown in FIG. 2, the thermal stress relaxation layers 143 and 144 of the bonding members 133 and 134 which are bonded to the n-type thermoelectric conversion member 112 and the diffusion prevention layers 153 and 154 may be bonded by auxiliary bonding layers 213 and 214, respectively.

The auxiliary bonding layers 213 and 214 have an effect of allowing the thermal stress relaxation layers 143 and 144 and the diffusion prevention layers 153 and 154 to be easily bonded respectively. The auxiliary bonding layers 213 and 214 are composed of the same material as that of the electrode members, and thus element diffusion between the thermal stress relaxation layers 143 and 144 and the diffusion prevention layers 153 and 154 may be prevented.

The thermal stress relaxation layers 141 to 144 are composed of an M4 (M4 represents at least one kind of element selected from a group consisting of Cu, Ag, Au, Al, and Mg)-M3 alloy and are formed from, for example, an Ag56 (% by weight)-Cu22 (% by weight)-Zn17 (% by weight)-Sn5 (% by weight) alloy.

In addition, the auxiliary bonding layers 213 and 214 are composed of at least one kind of alloy selected from a group consisting of an Fe alloy, a Ni alloy, a Co alloy, a Cu alloy, a Ti alloy, and an Al alloy and are formed from, for example, SUS430.

Furthermore, the n-type diffusion prevention layers 153 and 154 that are bonded to the thermoelectric conversion member 112 are composed of at least one kind of alloy selected from a group consisting of an Fe-M1 alloy, a Co-M1 alloy, a Ni-M1 alloy, a Ti-M2 alloy, a Zr-M2 alloy, a Hf-M2 alloy, a V-M2 alloy, a Nb-M2 alloy, a Ta-M2 alloy, a Cr-M2 alloy, a Mo-M2 alloy, and a W-M2 alloy.

More specifically, the diffusion prevention layers 153 and 154 are composed of an M6-M2 alloy containing 50% by weight or more and less than 1.00% by weight of M6 (M6 represents at least one kind of element selected from a group consisting of Ti, Zr, Hf, V, Nb, Ta, Cr, Mo, W, and Mn) and more than 0% by weight and 50% by weight or less of M2 and are formed from a Ti80Al20 (% by weight) alloy.

In the thermoelectric conversion module 200, the thermal stress relaxation layers 143 and 144 of the bonding members 133 and 134 which are bonded to the n-type thermoelectric conversion member 112 and the diffusion prevention layers 153 and 154 are bonded by the auxiliary bonding layers 213 and 214.

The auxiliary bonding layers 213 and 214 are composed of at least one kind of alloy selected from a group consisting of an Fe alloy, a Ni alloy, a Co alloy, a Cu alloy, a Ti alloy, and an Al alloy, which is the same material as that of the electrode members, and thus have an effect of allowing the thermal stress relaxation layers 143 and 144 and the diffusion prevention layers 153 and 154 to be easily bonded to each other and are capable of preventing element diffusion between the thermal stress relaxation layers 143 and 144 and the diffusion prevention layers 153 and 154.

Furthermore, since the auxiliary bonding layers 213 and 214 and the electrode members 121 to 123 are formed from the same SUS430, it is possible to keep a decrease in productivity due to extension of the auxiliary bonding layers 213 and 214 to a minimum.

Figure 3:
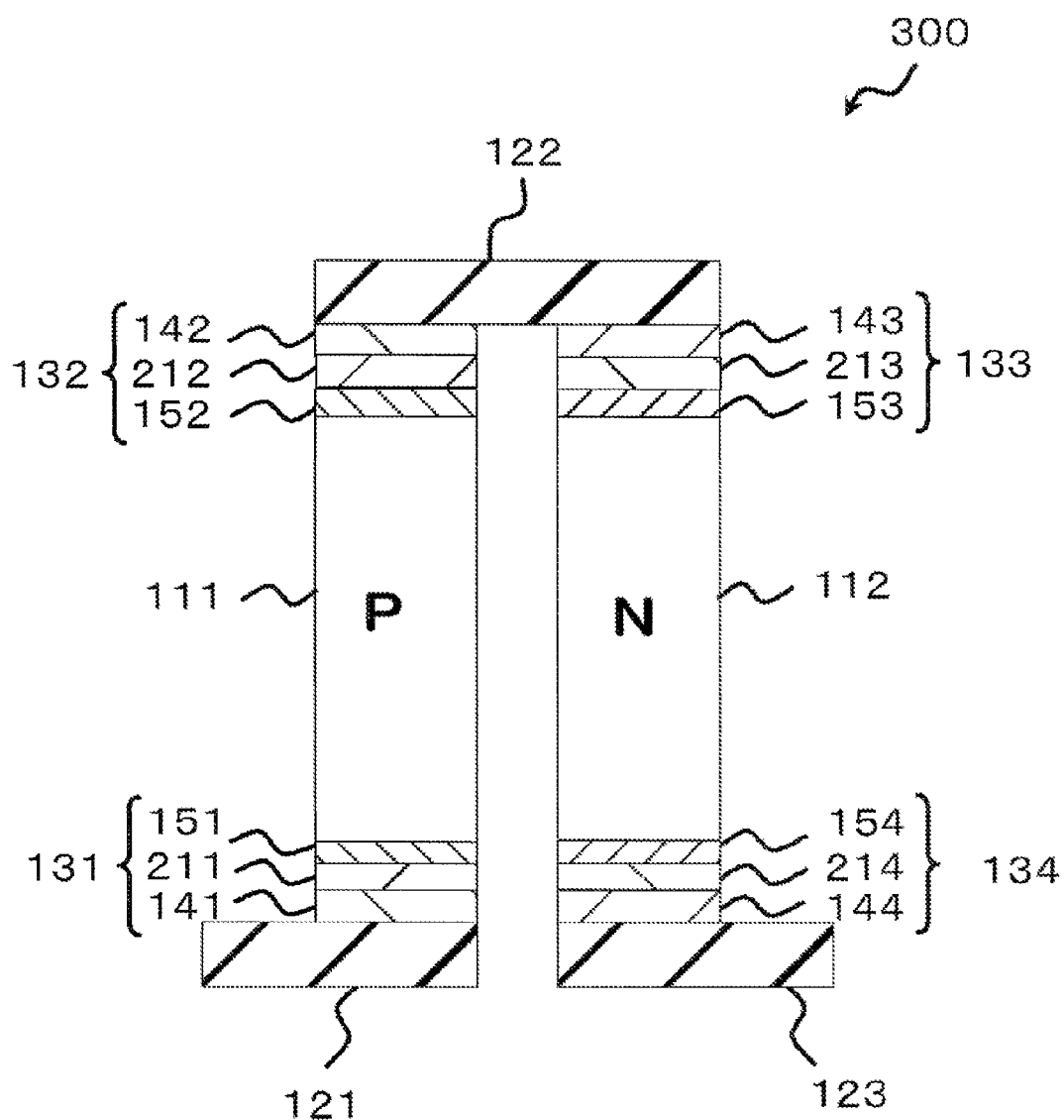
FIG. 3 shows a schematic front view illustrating a structure of a thermoelectric conversion module of another modification example.

Furthermore, like a thermoelectric conversion module 300 illustrated in FIG. 3, the thermal stress relaxation layers 141 to 144 of the bonding members 131 to 134 which are bonded to the p-type and n-type thermoelectric conversion member 111 and 112 and the diffusion prevention layers 151 to 154 may be bonded by auxiliary bonding layers 211 to 214, respectively.

The thermal stress relaxation layer is composed of an M4-M3 alloy, and is formed from, for example, a Cu70 to 90 (% by weight)-P5 to 10 (% by weight)-Ag5 to 20 (% by weight) alloy, and/or a Cu60 to 85 (% by weight)-P5 to 10 (% by weight)-Ag5 to 15 (% by weight)-Sn5 to 20 (% by weight) alloy.

In addition, the auxiliary bonding layers 211 to 214 are composed of at least one kind of alloy selected from a group consisting of an Fe alloy, a Ni alloy, a Co alloy, a Cu alloy, a Ti alloy, and an Al alloy, which is the same material as that of the electrode members.

Therefore, the auxiliary bonding layers 211 to 214 have an effect of allowing the thermal stress relaxation layers 141 to 144 and the diffusion prevention layers 151 to 154 to be easily bonded to each other, and are capable of preventing element diffusion between the thermal stress relaxation layers 141 to 144 and the diffusion prevention layers 151 to 154.

In addition, in the thermoelectric conversion module 100 of the embodiment, the electrode members 121 to 123 are also composed of the M4-M3 alloy containing 50% by weight or more and less than 100% by weight of M4 and more than 0% by weight and 50% by weight or less of M3 and are formed from, for example, a Cu50 to 60 (% by weight)-Cr40 to 50 (% by weight) alloy.

In this thermoelectric conversion module 300, since the thermal stress relaxation layers 141 to 144 and the diffusion prevention layers 151 to 154 of the bonding members 131 to 134 are bonded by the auxiliary bonding layers 211 to 214, respectively, peeling between the thermal stress relaxation layers 141 to 144 and the diffusion prevention layers 151 to 154 by the high-temperature thermal stress due to the operation may be prevented in a satisfactory manner.

Furthermore, since the auxiliary bonding layers 211 to 214 and the electrode members 121 to 123 are formed from the same Cu50 to 60 (% by weight)-Cr40 to 50 (% by weight) alloy, it is possible to make a decrease in productivity due to extension of the auxiliary bonding layers 211 to 214 to the minimum.

EXAMPLES

The invention is not limited to the above-described embodiment, and changes, modification, and the like within a range of capable of accomplishing the object of the invention are included in the invention. Hereinafter, the thermoelectric conversion module of the invention will be described in detail with reference to examples.

Examples 1 to 9

Table 1 shows details of members used in Examples 1 to 9.

The thermoelectric conversion members 111 and 112, the electrode members 121 to 123, and the bonding members 131 to 134 shown in Table 1 were prepared, and the thermoelectric conversion members 111 and 112 and the diffusion prevention layers 151 to 154 of the bonding members or, otherwise, the thermoelectric conversion members 111 to 112, the diffusion prevention layers 151 to 154 of the bonding members, and the auxiliary bonding layers 211 to 214 are bonded integrally with each other using a spark plasma sintering method at a temperature of 500° C. to 750° C. and a pressure of 30 MPa to 60 MPa under an inert gas atmosphere for a sintering time of 10 minutes to 30 minutes. Then, the resultant bonded body was cut into prism-shaped elements of 5 nm×5 mm×7.4 nm.

32 pairs of p-type and n-type prism-shaped elements were arranged in an area of 50 mm square by using 32 pieces of the p-elements and 32 pieces of the n-type elements. Furthermore, the electrode members were bonded to the p-type and n-type prism-shaped elements using stress relaxation layer materials of the bonding members shown in Table 1 in a vacuum or inert gas atmosphere at a temperature of 500° C. to 750° C. and a pressure of 10 MPa to 50 MPa for a holding time of 10 minutes to 60 minutes to prepare thermoelectric conversion modules having an area of 50×50 mm$^2$ and a height of 8 mm.

With respect to each of the thermoelectric conversion modules prepared according to the above-described method, a thermal cycle test was carried out. Specifically, the thermal cycle test was carried out in a vacuum or inert gas atmosphere in such a manner that a block heater was used on a high-temperature side and a low-temperature side was kept to a temperature to 50° C. or lower by water cooling.

The temperature of the electrode member 122 on a high-temperature side was controlled in such a manner that the temperature was raised from 200° C. for 60 minutes, was held at 600° C. to 700° C. for 30 minutes, and was lowered to 200° C. for 30 minutes, and 100 cycles of these were carried out. As the result, a variation in power generation performance of the thermoelectric conversion module and an increase in an internal resistance, which were measured for each cycle, were not recognized, and it was proved that the bonding was very satisfactory.

After the thermal cycle test, power generation characteristics of the thermoelectric conversion module were measured under conditions in which a high-temperature end was 600° and 700° C., and a low-temperature end was 50° C., and from measurement, the maximum electricity output was 20 W to 35 W.

Furthermore, a bonding state between thermoelectric conversion members and the electrode members after the thermal cycle test was observed and an element distribution was analyzed. As a result, the bonding state was satisfactory, and mutual element diffusion between the thermoelectric conversion members and the electrode members was not recognized.

From the above-described test results, in the thermoelectric conversion modules of Examples 1 to 9, it was confirmed that even when a temperature largely varied due to operation and the like, the bonding between the thermoelectric conversion members 111 and 112 and the electrode members 121 to 123 was maintained in a satisfactory manner.

Furthermore, in the thermoelectric conversion modules of the examples, it was also confirmed that even when temperature rising and temperature lowering were repeated, highly efficient power generation could be stably carried. According to this, it was verified that the structure and production method of the thermoelectric conversion module of the invention could relax the thermal stress and could prevent element diffusion between the thermoelectric members and the electrode members.

TABLE 1

| Symbol | Member name | Example 1 | Example 2 | Example 3 |
|---|---|---|---|---|
| 111 | p-type thermoelectric conversion member | La0.7Ba0.01Ga0.1Ti0.1Fe3Co1Sb12 | La0.7Ba0.01Ga0.1Ti0.1Fe3Co1Sb12 | La0.7Ba0.01Ga0.1Ti0.1Fe3Co1Sb12 |
| 112 | n-type thermoelectric conversion member | Yb0.3Ca0.1Al0.1Ga0.1In0.1Co3.75Fe0.25Sb12 | Yb0.3Ca0.1Al0.1Ga0.1In0.1Co3.75Fe0.25Sb12 | Yb0.3Ca0.1Al0.1Ga0.1In0.1Co3.75Fe0.25Sb12 |
| | Size of p/n-type thermoelectric conversion member | 5 × 5 × 7 mm | 5 × 5 × 7 mm | 5 × 5 × 7 mm |
| 121 to 123 | Electrode member | SUS430 | SUS430 | SUS430 |
| | Size of electrode member | 5 × 11 × 0.5 mm | 5 × 11 × 0.5 mm | 5 × 11 × 0.5 mm |
| 131, 132 | Bonding member of p-type thermoelectric conversion member | | | |
| 141, 142 | Stress relaxation layer | Ag56Cu22Zn17Sn5 (% by weight) | Ag56Cu22Zn17Sn5 (% by weight) | Cu79P7.8Ag6Sn7.2 (% by weight) |
| 151, 152 | Diffusion prevention layer | Fe78Cr17Si5 (% by weight) | Fe78Cr17Si5 (% by weight) | Fe78Cr17Si5 (% by weight) |
| 211, 212 | Auxiliary bonding layer | | | Cu60Cr40 (% by weight) |
| 133, 134 | Bonding member of n-type thermoelectric conversion member | | | |
| 143, 144 | Stress relaxation layer | Ag56Cu22Zn17Sn5 (% by weight) | Ag56Cu22Zn17Sn5 (% by weight) | Cu79P7.8Ag6Sn7.2 (% by weight) |
| 153, 154 | Diffusion prevention layer | Fe65Cr35 (% by weight) | Ti80Al20 (% by weight) | Ti80Al20 (% by weight) |
| 213, 214 | Auxiliary bonding layer | | SUS430 | Cu60Cr40 (% by weight) |

| Symbol | Member name | Example 4 | Example 5 | Example 6 |
|---|---|---|---|---|
| 111 | p-type thermoelectric conversion member | La0.8Ba0.01Ga0.01Ti0.1Fe3.5Co0.5Sb12 | La0.8Ba0.01Ga0.01Ti0.1Fe3.5Co0.5Sb12 | La0.8Ba0.01Ga0.01Ti0.1Fe3.5Co0.5Sb12 |
| 112 | n-type thermoelectric conversion member | Yb0.2Ca0.1Al0.1Co4Sb12 | Yb0.2Ca0.1Al0.1Co4Sb12 | Yb0.2Ca0.1Al0.1Co4Sb12 |
| | Size of p/n-type thermoelectric conversion member | 5 × 5 × 7 mm | 5 × 5 × 7 mm | 5 × 5 × 7 mm |
| 121 to 123 | Electrode member | SUS430 | SUS430 | Cu50Cr50 (% by weight) |
| | Size of electrode member | 5 × 11 × 0.5 mm | 5 × 11 × 0.5 mm | 5 × 11 × 0.5 mm |
| 131, 132 | Bonding member of p-type thermoelectric conversion member | | | |
| 141, 142 | Stress relaxation layer | Ag60Cu30Sn10 (% by weight) | Ag60Cu30Sn10 (% by weight) | Cu83P7Ag6 (% by weight) |
| 151, 152 | Diffusion prevention layer | Ni80Ti20 (% by weight) | Ni80Ti20 (% by weight) | Ni80Ti20 (% by weight) |
| 211, 212 | Auxiliary bonding layer | | | Cu50Cr50 (% by weight) |
| 133, 134 | Bonding member of n-type thermoelectric conversion member | | | |
| 143, 144 | Stress relaxation layer | Ag60Cu30Sn10 (% by weight) | Ag60Cu30Sn10 (% by weight) | Cu83P7Ag6 (% by weight) |
| 153, 154 | Diffusion prevention layer | Fe80Y20 (% by weight) | Ti80Al15Sn5 (% by weight) | Ti80Al15Sn5 (% by weight) |
| 213, 214 | Auxiliary bonding layer | | SUS430 | Cu50Cr50 (% by weight) |

TABLE 1-continued

| Symbol | Member name | Example 7 | Example 8 | Example 9 |
|---|---|---|---|---|
| 111 | p-type thermoelectric conversion member | La0.7Ba0.01Ga0.1Ti0.1Fe3Co1Sb12 | La0.7Ba0.01Ga0.1Ti0.1Fe3Co1Sb12 | La0.8Ba0.01Ga0.1Ti0.1Fe3.5Co0.5Sb12 |
| 112 | n-type thermoelectric conversion member | Yb0.3Ca0.1Al0.1Ga0.1In0.1Co3.75Fe0.25Sb12 | Yb0.3Ca0.1Al0.1Ga0.1In0.1Co3.75Fe0.25Sb12 | Yb0.2Ca0.1Al0.1Co4Sb12 |
| 121 to 123 | Size of p/n-type thermoelectric conversion member | 5 × 5 × 7 mm | 5 × 5 × 7 mm | 5 × 5 × 7 mm |
| | Electrode member | SUS430 | Cu | Cu |
| | Size of electrode member | 5 × 11 × 0.5 mm | 5 × 11 × 0.5 mm | 5 × 11 × 0.5 mm |
| 131, 132 | Bonding member of p-type thermoelectric conversion member | | | |
| 141, 142 | Stress relaxation layer | Ag56Cu22Zn17Sn5 (% by weight) | Ag56Cu22Zn17Sn5 (% by weight) | Ag56Cu22Zn17Sn5 (% by weight) |
| 151, 152 | Diffusion prevention layer | Fe78Cr17Si5 (% by weight) | Fe78Cr17Si5 (% by weight) | Fe78Cr17Si5 (% by weight) |
| 211, 212 | Auxiliary bonding layer | | | |
| 133, 134 | Bonding member of n-type thermoelectric conversion member | | | |
| 143, 144 | Stress relaxation layer | Ag56Cu22Zn17Sn5 (% by weight) | Ag56Cu22Zn17Sn5 (% by weight) | Ag56Cu22Zn17Sn5 (% by weight) |
| 153, 154 | Diffusion prevention layer | Fe82Cr13V5 (% by weight) | Fe82Cr13V5 (% by weight) | Fe82Cr13V5 (% by weight) |
| 213, 214 | Auxiliary bonding layer | | | |

The invention claimed is:

1. A thermoelectric conversion module, comprising:
a thermoelectric conversion member; and
an electrode member,
wherein:
the thermoelectric conversion member and the electrode member are bonded by a bonding member,
the bonding member includes a thermal stress relaxation layer that is bonded to the electrode member to relax a thermal stress, and a diffusion prevention layer that is bonded to the thermoelectric conversion member to prevent diffusion of a constituent component,
the Young's modulus of the thermal stress relaxation layer at 25° C. is smaller than that of the thermoelectric conversion members and the electrode members, and
the thermal stress relaxation layer is at least one selected from the group consisting of an Ag (50 to 60% by weight)-Cu, Zn (40 to 50% by weight) alloy, an Ag (50 to 60% by weight)-Cu, Zn, Sn (40 to 50% by weight) alloy, a Cu (70 to 90% by weight)-P (5 to 10% by weight)-Ag (5 to 20% by weight) alloy, and a Cu (60 to 85% by weight)-P (5 to 10% by weight)-Ag (5 to 15% by weight)-Sn (5 to 20% by weight) alloy.

2. The thermoelectric conversion module according to claim 1, wherein the thermal stress relaxation layer has Young's modulus of 130 GPa or less at 25° C.

3. The thermoelectric conversion module according to claim 1, wherein:
the electrode member is composed of at least one kind of alloy selected from a group consisting of an Fe alloy, a Ni alloy, a Co alloy, a Cu alloy, a Ti alloy, and an Al alloy, and
the diffusion prevention layer is composed of at least one kind of alloy selected from a group consisting of an Fe-M1 (M1 represents at least one kind of element selected from a group consisting of Cr, Mo, W, V, Nb, Ta, Mn, Ti, Zr, Hf, C, Si, and Ge) alloy, a Co-M1 alloy, a Ni-M1 alloy, a Ti-M2 (M2 represents at least one kind of element selected from a group consisting of Al, Ga, In, Cu, Ag, Au, Sn, Zn, and Mg) alloy, a Zr-M2 alloy, a Hf-M2 alloy, a V-M2 alloy, a Nb-M2 alloy, a Ta-M2 alloy, a Cr-M2 alloy, a Mo-M2 alloy, and a W-M2 alloy.

4. The thermoelectric conversion module according to claim 1, wherein:
the bonding member further comprises an auxiliary bonding layer,
the thermal stress relaxation layer and the diffusion prevention layer are bonded by the auxiliary bonding layer, and
the auxiliary bonding layer is composed of at least one kind of alloy selected from a group consisting of an Fe alloy, a Ni alloy, a Co alloy, a Cu alloy, a Ti alloy, and an Al alloy.

5. The thermoelectric conversion module according to claim 1, wherein the diffusion prevention layer is composed of an M5-M1 alloy containing 50% by weight or more and less than 100% by weight of M5 (M5 represents at least one kind of element selected from a group consisting of Fe, Co, and Ni) and more than 0% by weight and 50% by weight or less of M1 (M1 represents at least one kind of element selected from a group consisting of Cr, Mo, W, V, Nb, Ta, Mn, Ti, Zr, Hf, C, Si, and Ge).

6. The thermoelectric conversion module according to claim 1, wherein the diffusion prevention layer is composed of an M6-M2 alloy containing 50% by weight or more and less than 100% by weight of M6 (M6 represents at least one kind of element selected from a group consisting of Ti, Zr, Hf, V, Nb, Ta, Cr, Mo, and W) and more than 0% by weight and 50% by weight or less of M2 (M2 represents at least one kind of element selected from a group consisting of Al, Ga, In, Cu, Ag, Au, Sn, Zn, and Mg).

7. The thermoelectric conversion module according to claim 1, wherein a difference in a thermal expansion coefficient between the diffusion prevention layer and the thermoelectric conversion member at 20° C. to 600° C. is 20% or less of the thermal expansion coefficient of the thermoelectric conversion member.

8. The thermoelectric conversion module according to claim 1, wherein the thermal expansion coefficient of the diffusion prevention layer at 20° C. to 600° C. is $8 \times 10^{-6}$ (/K) or more and $15 \times 10^{-6}$ (/K) or less.

9. The thermoelectric conversion module according to claim 1, wherein the thermoelectric conversion member is composed of an Sb system having a Skutterudite structure.

10. The thermoelectric conversion module according to claim 1, wherein the thermoelectric conversion member is composed of an Sb system having a filled Skutterudite structure.

* * * * *